(12) United States Patent
Armitage et al.

(10) Patent No.: US 11,404,473 B2
(45) Date of Patent: *Aug. 2, 2022

(54) III-NITRIDE MULTI-WAVELENGTH LED ARRAYS

(71) Applicant: Lumileds LLC, San Jose, CA (US)

(72) Inventors: Robert Armitage, Los Altos, CA (US); Isaac Wildeson, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 73 days.

This patent is subject to a terminal disclaimer.

(21) Appl. No.: 16/725,445

(22) Filed: Dec. 23, 2019

(65) Prior Publication Data

US 2021/0193730 A1    Jun. 24, 2021

(51) Int. Cl.
*H01L 27/15* (2006.01)
*H01L 33/24* (2010.01)
(Continued)

(52) U.S. Cl.
CPC ........ *H01L 27/156* (2013.01); *H01L 33/0075* (2013.01); *H01L 33/24* (2013.01); *H01L 33/32* (2013.01); *H01L 33/38* (2013.01)

(58) Field of Classification Search
CPC ... H01L 27/156; H01L 33/0075; H01L 33/24; H01L 33/32; H01L 33/38; H01L 33/007; H01L 33/06; H01L 27/153
See application file for complete search history.

(56) References Cited

U.S. PATENT DOCUMENTS 6,075,316 A    6/2000  Shi et al.
6,410,942 B1   6/2002  Thibeault et al.
(Continued)

FOREIGN PATENT DOCUMENTS

EP    3410002 A1    12/2018
JP    2016066765 A  4/2016
(Continued)

OTHER PUBLICATIONS

Chang, Shoou-Jinn, et al., "Cascaded GaN Light-Emitting Diodes With Hybrid Tunnel Junction Layers", IEEE Journal of Quantum Electronics, vol. 51, No. 8, Aug. 2015.
(Continued)

*Primary Examiner* — Su C Kim
(74) *Attorney, Agent, or Firm* — Servilla Whitney LLC

(57) ABSTRACT

Described are arrays of light emitting diode (LED) devices and methods for their manufacture. An LED array comprises a first mesa comprising a top surface, at least a first LED including a first p-type layer, a first n-type layer and a first color active region and a tunnel junction on the first LED, the top surface comprising a second n-type layer on the tunnel junction. The LED array further comprises an adjacent mesa comprising a top surface, the first LED, a second LED including the second n-type layer, a second p-type layer and a second color active region. There is a first trench separating the first mesa and the adjacent mesa, n-type metallization in the first trench and in electrical contact with the first color active region and the second color active region of the adjacent mesa, and p-type metallization contacts on the n-type layer of the first mesa and on the p-type layer of the adjacent mesa.

20 Claims, 13 Drawing Sheets

(51) Int. Cl.
  *H01L 33/00* (2010.01)
  *H01L 33/32* (2010.01)
  *H01L 33/38* (2010.01)

(56) References Cited

U.S. PATENT DOCUMENTS

| | | |
|---|---|---|
| 6,657,236 B1 | 12/2003 | Thibeault et al. |
| 6,821,804 B2 | 11/2004 | Thibeault et al. |
| 6,822,991 B2 | 11/2004 | Collins, III et al. |
| 7,525,248 B1 * | 4/2009 | Fan ................ H01L 25/0753 313/498 |
| 7,723,737 B2 * | 5/2010 | Lee .................... H01L 33/24 257/88 |
| 9,112,112 B2 | 8/2015 | Do et al. |
| 9,192,290 B2 | 11/2015 | Spinnler et al. |
| 9,224,595 B2 | 12/2015 | Akihiko et al. |
| 9,496,465 B2 | 11/2016 | Sugimoto et al. |
| 9,507,204 B2 | 11/2016 | Pelka et al. |
| 9,722,160 B2 | 8/2017 | Nakabayashi |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,396,240 B2 | 8/2019 | Yeh et al. |
| 10,490,598 B2 | 11/2019 | Yang et al. |
| 10,804,429 B2 * | 10/2020 | Wildeson ............ H04B 10/572 |
| 2009/0078955 A1 | 3/2009 | Fan et al. |
| 2009/0085048 A1 * | 4/2009 | Lee .................... H01L 27/156 257/89 |
| 2013/0016752 A1 * | 1/2013 | Lell .................... H01S 5/3013 372/50.1 |
| 2014/0094878 A1 | 4/2014 | Gossler et al. |
| 2015/0228873 A1 | 8/2015 | Gebuhr et al. |
| 2016/0099300 A1 | 4/2016 | Lee et al. |
| 2016/0190400 A1 | 6/2016 | Jung et al. |
| 2016/0293811 A1 | 10/2016 | Hussell et al. |
| 2017/0025567 A1 | 1/2017 | Lu et al. |
| 2017/0098746 A1 | 4/2017 | Bergmann et al. |
| 2017/0213868 A1 * | 7/2017 | Damilano ............ H01L 27/156 |
| 2017/0243860 A1 | 8/2017 | Hong et al. |
| 2017/0293065 A1 | 10/2017 | Kim |
| 2017/0358563 A1 | 12/2017 | Cho et al. |
| 2017/0358724 A1 | 12/2017 | Shichijo et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0323338 A1 | 11/2018 | Grundmann et al. |
| 2018/0331255 A1 | 11/2018 | Grundmann et al. |
| 2018/0339643 A1 | 11/2018 | Kim |
| 2018/0339644 A1 | 11/2018 | Kim |
| 2018/0354406 A1 | 12/2018 | Park |
| 2019/0198561 A1 | 6/2019 | Wildeson et al. |
| 2019/0198709 A1 | 6/2019 | Wildeson et al. |
| 2019/0295992 A1 | 9/2019 | Ahmed et al. |
| 2019/0319066 A1 | 10/2019 | Tan et al. |

FOREIGN PATENT DOCUMENTS

| | | |
|---|---|---|
| KR | 20140118466 A | 10/2014 |
| KR | 20170018687 A | 2/2017 |
| KR | 20180010670 A | 1/2018 |
| KR | 20180114413 A | 10/2018 |
| KR | 20180129898 A | 12/2018 |
| TW | 201407815 A | 2/2014 |
| WO | 2017102708 A1 | 6/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2018204402 A1 | 11/2018 |

OTHER PUBLICATIONS

Ding, Kai, et al., "Micro-LEDs, a Manufacturability Perspective", Appl. Sci. 2019, 9, 1206; doi:10.3390/app9061206.

Dupre, Ludovic, et al., "Processing and characterization of high resolution GaN/InGaN LED arrays at 10 micron pitch for micro display applications.", Proc. of SPIE vol. 10104 1010422-1.

El-Ghoroury, Hussein S., et al., "Growth of monolithic full-color GaN-based LED with intermediate carrier blocking layers", AIP Advances 6, 075316 (2016); https://doi.org/10.1063/1.4959897, Jul. 22, 2016.

Sekiguchi, Hiroto, et al., "Emission color control from blue to red with nanocolumn diameter of InGaN/GaN nanocolumn arrays grown on same substrate", Appl. Phys. Lett. 96, 231104 (2010); doi: 10.1063/1.3443734.

European Search Report, dated Jul. 29, 2020, 7 pages.

"Non-Final Office Action in U.S. Appl. No. 16/725,445 dated Jul. 8, 2021, 14 pages".

PCT International Search Report and Written Opinion in PCT/US2021/051175 dated Jan. 7, 2022, 12 pages.

PCT International Search Report and Written Opinion in PCT/US2020/063051 dated Mar. 12, 2021, 12 pages.

* cited by examiner

III-NITRIDE MULTI-WAVELENGTH LED ARRAYS

TECHNICAL FIELD

Embodiments of the disclosure generally relate to arrays of light emitting diode (LED) devices and methods of manufacturing the same. More particularly, embodiments are directed to arrays of light emitting diode devices comprising III-nitride layers on a wafer which provide microLEDs comprising tunnel junctions.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

Various emerging display applications, including wearable devices, head-mounted, and large-area displays require miniaturized chips composed of arrays of microLEDs (μLEDs or uLEDs) with a high density having a lateral dimension down to less than 100 μm×100 μm. MicroLEDs (uLEDs) typically have dimensions of about 50 μm in diameter or width and smaller that are used to in the manufacture of color displays by aligning in close proximity microLEDs comprising red, blue and green wavelengths. Generally, two approaches have been utilized to assemble displays constructed from individual microLED dies. The first is a pick-and-place approach, which comprises picking up and then aligning and attaching each individual blue, green and red wavelength microLED onto a backplane, followed by electrically connecting the backplane to a driver integrated circuit. Due to the small size of each microLED, this assembly sequence is slow and subject to manufacturing errors. Furthermore, as the die size decreases to satisfy increasing resolution requirements of displays, larger and larger numbers of die must be transferred at each pick and place operation to populate a display of required dimensions.

Alternatively, to avoid the complicated pick-and-place mass transfer process, a variety of monolithic fabrication methods have been proposed to realize microLED displays. It would be desirable to provide LED devices and methods of making LED devices which provide for monolithic fabrication methods.

SUMMARY

Embodiments of the disclosure are directed to LED arrays and methods for manufacturing LED arrays. In a first embodiment, a light emitting diode (LED) array comprises a first mesa comprising a top surface, at least a first LED including a first p-type layer, a first n-type layer and a first color active region and a first tunnel junction on the first LED, the top surface of the first mesa comprising a second n-type layer on the first tunnel junction; an adjacent mesa comprising a top surface, the first LED, a second LED including the second n-type layer, a second p-type layer, and a second color active region; a second tunnel junction on the second LED of the adjacent mesa, and a third n-type layer on the second tunnel junction of the adjacent mesa; a first trench separating the first mesa and the adjacent mesa; n-type metallization in the first trench and in electrical contact with the first color active region and the second color active region of the adjacent mesa; and p-type metallization contacts on the second n-type layer of the first mesa and on the top surface of the adjacent mesa.

In a second embodiment, the first embodiment is modified so that the top surface of the adjacent mesa comprises the third n-type layer.

In a third embodiment, the first embodiment further comprises a third color active region on the n-type layer of the adjacent mesa and the adjacent mesa comprises a top surface including a third p-type layer; a third mesa comprising the first LED, second LED, the second tunnel junction, and the third n-type layer on the second tunnel junction; a second trench separating the adjacent mesa and the third mesa; n-type metallization in the second trench and in electrical contact with the first color active region and the second color active region of the third mesa and the n-type metallization in the first trench in electrical contact with the first color active region, the second color active region and the third color active region of the adjacent mesa; and a p-type metallization contact on the third n-type layer of the third mesa.

In a fourth embodiment, the third embodiment includes a feature that the third p-type layer of the adjacent mesa is a non-etched p-type layer. In a fifth embodiment the third or fourth is modified wherein the first color active region is a blue color active region and the second color active region is a green color active region. In a sixth embodiment, the third or fourth embodiment is modified wherein the first color active region is a blue color active region, the second color active region is a green color active region and the third color active region is a red color active region.

In a seventh embodiment, any of the first through sixth embodiments are modified so that the first p-type layer, the second p-type layer, the first n-type layer and the second n-type layer comprise a III-nitride material. In an eighth embodiment, the seventh embodiment includes the feature that the III-nitride material comprises GaN. In a ninth embodiment, any of the third through the sixth embodiments include the features that the first p-type layer, the second p-type layer, the third p-type layer, the first n-type layer, the first n-type layer, the second n-type layer and the third n-type layer comprise a III-nitride material. In a tenth embodiment, the ninth embodiment is such that the III-nitride material comprises GaN.

In an eleventh embodiment, any of the first through tenth embodiments include the feature that the first mesa has a sidewall and the adjacent mesa has a sidewall and the first mesa sidewall and the adjacent mesa sidewall form an angle with a top surface of a substrate upon which the mesas are formed in a range of from 75 to less than 90 degrees.

Another aspect of the disclosure pertains to an electronics system and in a twelfth embodiment, an electronic system comprising the LED array of any of the first through eleventh embodiments and driver circuitry configured to provide independent voltages to one or more of p-metallization contacts. In a thirteenth embodiment, the twelfth embodiment includes the feature wherein the electronic system is selected from the group consisting of a LED-based luminaire, a light emitting strip, a light emitting sheet, an optical display, and a microLED display.

Another aspect pertains to a method of manufacturing an LED array. In a fourteenth embodiment, a method comprises forming a first mesa comprising a top surface, at least a first LED including a first p-type layer, a first n-type layer and a first color active region and a first tunnel junction on the first LED, the top surface comprising a second n-type layer on the first tunnel junction; forming an adjacent mesa comprising the first LED, a second LED including the second n-type layer, a second p-type layer and a second color active region; forming a second tunnel junction on the second LED of the adjacent mesa, and a third n-type layer on the second tunnel junction of the adjacent mesa p-type layer; forming a first trench separating the first mesa and the adjacent mesa; forming n-type metallization in the first trench which is in electrical contact with the first color active region and the second color active region of the adjacent mesa; and forming p-type metallization contacts on the second n-type layer of the first mesa and on the third n-type layer of the adjacent mesa.

In a fifteenth embodiment, the fourteenth embodiment further comprises forming a top surface of the adjacent mesa comprising the third n-type. In a sixteenth embodiment, the fourteenth or fifteenth embodiment further comprises forming a third color active region on the n-type layer of the adjacent mesa and the adjacent mesa comprises a top surface including a third p-type layer; forming a third mesa comprising a top surface, the first LED, the second LED, the second tunnel junction, and including the third n-type layer on the second tunnel junction; and the third color active region, the top surface of the third mesa comprising the third n-type layer; forming a second trench separating the adjacent mesa and the third mesa; forming n-type metallization in the second trench and in electrical contact with the first color active region and the second color active region of the third mesa and the n-type metallization in the first trench in electrical contact with the first color active region, the second color active region and the third color active region of the second adjacent mesa, and the n-type metallization in the first trench in electrical contact with the third color active region; and forming a p-type metallization contact on the third n-type layer of the third mesa.

In a seventeenth embodiment, the sixteenth embodiment is such that wherein each of the first LED, the second LED and the third LED comprise epitaxially deposited III-nitride material. In an eighteenth embodiment, the first LED, the second LED and the third LED are formed on a substrate. In a nineteenth embodiment, the eighteenth embodiment is such that the first trench and the second trench are formed by etching trenches to form the first mesa, the adjacent mesa and the third mesa. In a twentieth embodiment, the eighteenth or nineteenth embodiment are such that the III-nitride material comprises GaN.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
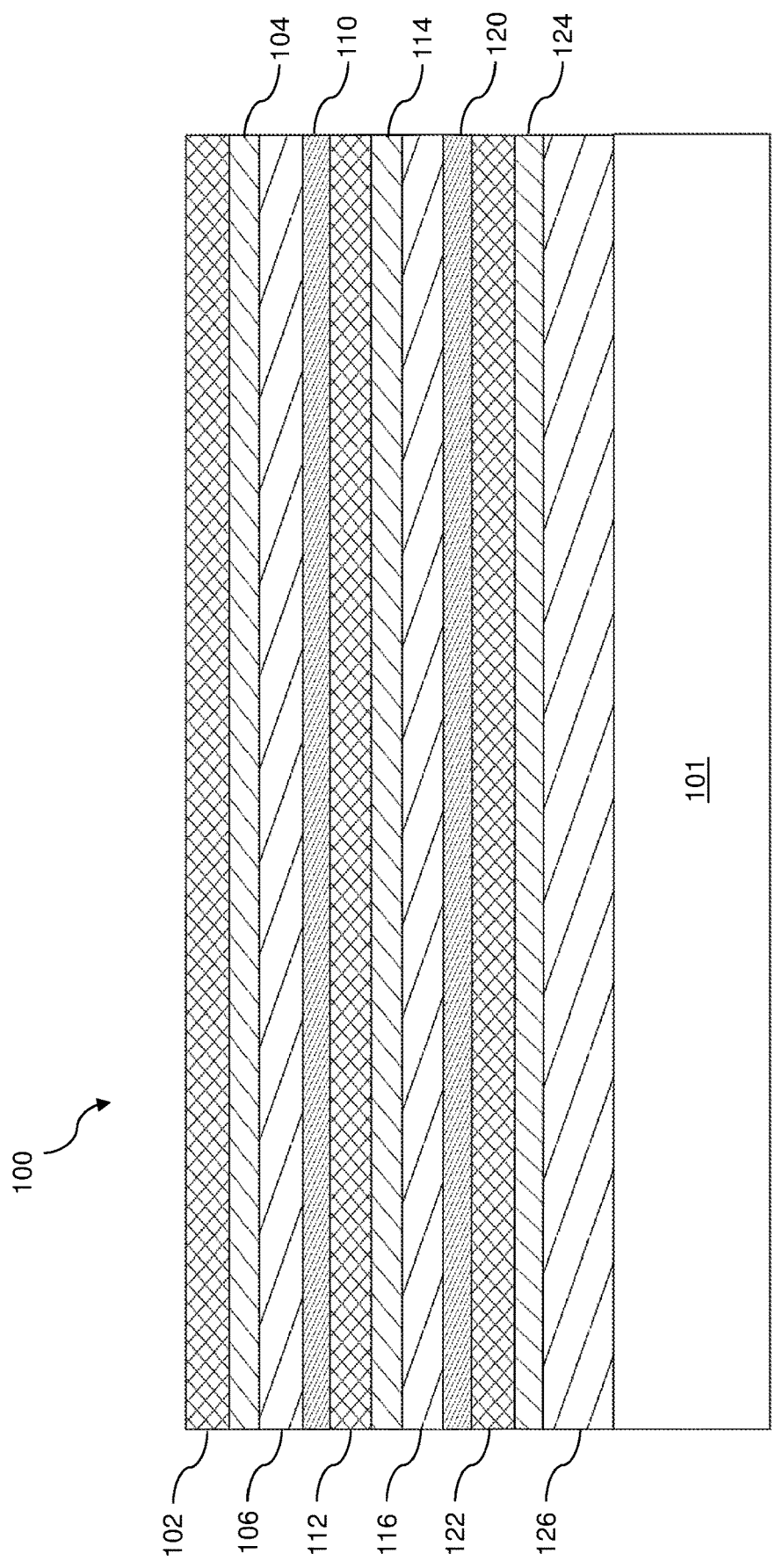
FIG. 1 illustrates a cross-sectional view of a red, green, and blue LED device including multiple quantum wells according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate or on a substrate with one or more layers, films, features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe arrays of LED devices and methods for forming arrays of LED devices (or LED arrays). In particular, the present disclosure describes LED devices and methods to produce LED devices which emit multiple colors or wavelengths from a single wafer. The positions and sizes of LED devices which emit multiple colors or wavelengths are controlled by adjusting lithography steps and etching depths in after epitaxial deposition of the materials that form the LED devices. In some embodiments, adjacent LEDs which emit multiple colors or wavelengths use a common n-type electrical contact. In some embodiments, the LEDs can be formed by using a process that does not require substrate removal. One or more embodiments of the disclosure can be used in the fabrication of microLED displays.

In one or more embodiments, a less complex microLED manufacturing process is provided by utilization of LED devices and methods for their manufacture which integrate two or more active regions emitting different wavelengths on a single wafer. Devices and methods described according to one or more embodiments utilize III-nitride materials, for example, materials in the AlInGaN materials system, which can be manufactured to form blue, green and red LEDs. Embodiments described herein provide a multi-color device such as a chip, which can be used in microLED display. In one or more embodiments, multiple layers are stacked in a single epitaxial growth process, and the multiple layers are configured to emit at different wavelength. Devices are provided which are configured so that respective emission intensity ratios can be changed between the emitters of different wavelengths.

According to one or more embodiments, devices and methods provide multiple quantum wells (MQW) configured to emit red, green, and blue light within a single active region, namely between the p- and n-layers of one p-n junction. In one or more embodiments, two or more pixels of different wavelengths in the same LED device are formed which comprise several p-n junctions on the same epitaxial wafer. By etching mesas using multiple steps as described further herein, embodiments provide the formation of independent electrical contacts to each of the p-n junctions. According to one or more embodiments, one or more emitter layers of different wavelengths are embedded in separate p-n junctions with separate current paths so the wavelength and radiance are controlled independently.

Figure 3:
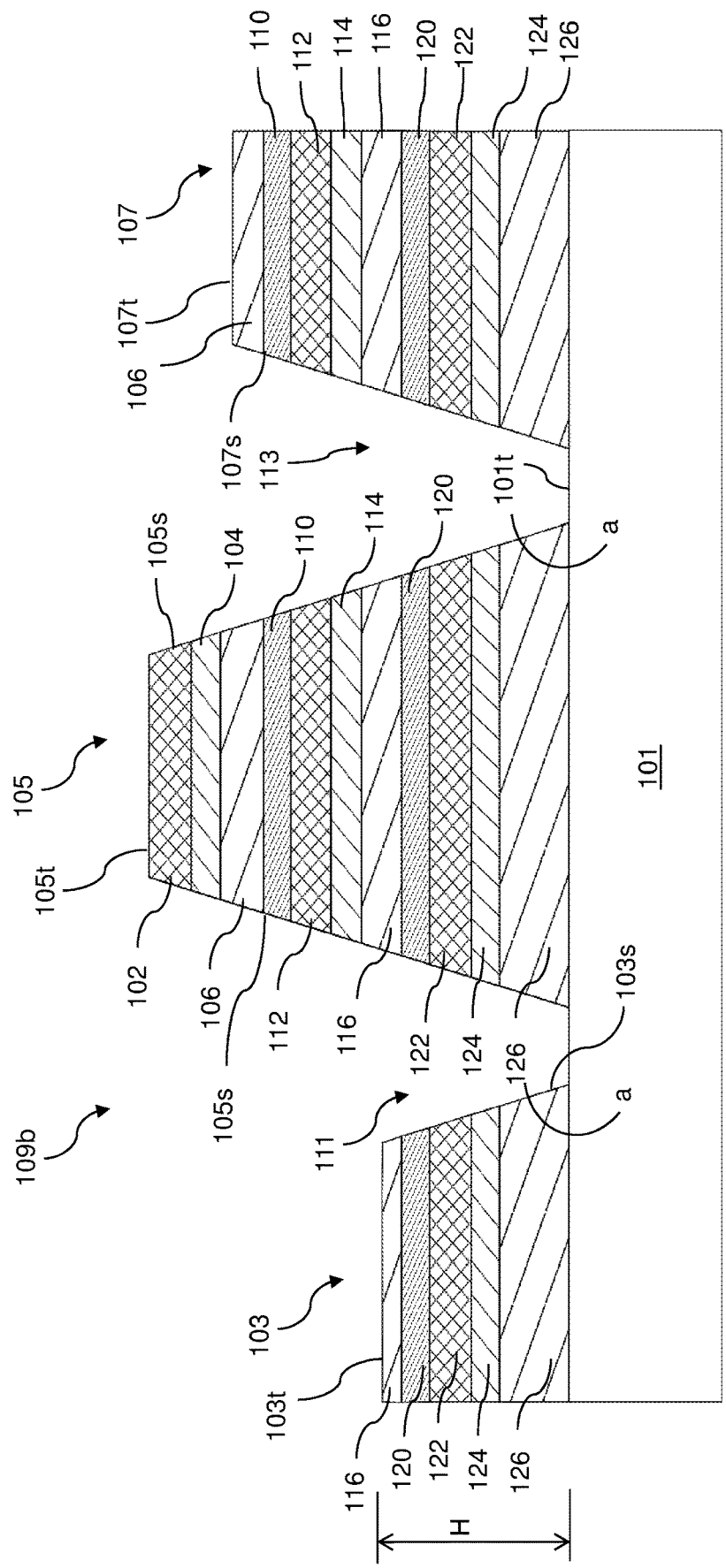
FIG. 3 illustrates the device of FIG. 2 after an etching process to provide three mesas to form a LED array.

FIG. 3 shows exemplary embodiment of a LED array configured to emit two or more different colors adjacent to each other on the same wafer. Several p-n junctions and active regions are stacked on top of each other, which in some embodiments are made by an epitaxial growth sequence in which unnecessary layers are removed by post-growth etching. In one or more embodiments, methods are provided which utilize dry etching to open trenches for contacting buried layers. However, it has been discovered that the process of dry etching introduces atomic level damage to the III-nitride crystal structure of the epitaxial layers, which changes conductivity type of p-type layers to n-type layers.

Due to this conductivity type conversion during dry etching, it is not possible to obtain ohmic contact of low resistance to a buried p-type nitride surface that has been exposed by dry etching. Thus, in a LED array 109 of the type shown in FIG. 3 processed by dry etching resulting in damage to the p-GaN surface, the non-ohmic contact to the dry etched p-GaN surface results in a forward voltage penalty of one volt or more for the blue and green active regions. Even if the voltage penalty was acceptable to a device manufacturer, the p-GaN layers would have to be grown much thicker than is optimal in order to provide a sufficient margin for error in controlling the etch rate to ensure that the etch stops in the p-GaN layer.

According to one or more embodiments, by incorporating tunnel junctions into the epitaxial layer, the functionality shown in FIG. 3 is achieved, but without the difficulties associated with trying to make electrical contacts to etched p-GaN surfaces. In specific embodiments, electrical contacts are made to n-type GaN layers, which can be grown to fairly high thickness without damaging the active region or inducing optical absorption losses. Embodiments of the lithography and etching methods described herein allow for the manufacture of LEDs configured to emit different colors at adjacent locations on the same wafer. A common n-type electrical contact is made to a group of different LED colors without requiring substrate removal.

According to one or more embodiments, LED arrays and processes for their manufacture are provided that result in a reduced number of separate epitaxy recipes which must be manufactured to produce source die for microLED displays compared to existing methods. The reduced number of epitaxy recipes reduces cost and complexity in the epitaxial manufacturing stage of LED array manufacture. Existing methods require production of separate blue, green, and red epitaxy recipes. In one or more embodiments, the number of pick and place operations required to populate a display is reduced, since arrays of pixels can be transferred together, instead of only one pixel at a time. Fewer pick and place operations will lead to cost and throughput improvements at the display assembly stage. In some embodiments, the need for pick and place operations is entirely eliminated and embodiments instead allow whole wafer-level transfer of pixels onto a display since each wafer can contain all three required colors (red, blue and green). In such embodiments, the entire processed wafer or a large piece of it could be incorporated directly into the display. According to one or more embodiments, the problem of having to make an ohmic electrical contact to etched p-GaN surfaces is avoided, making possible lower operating voltage and higher wall-plug efficiency. In some embodiments, restrictions on control of the etching rate are relaxed since all etched contacts in the tunnel junction are made to n-GaN layers which can be grown much thicker than p-GaN layers while maintaining high LED efficiency.

Thus, one or more embodiments provide a III-nitride based LED, such as a GaN-based LED wafer that contains two or more separate active regions configured to emit different colors, the active regions grown sequentially and connected by tunnel junctions. Embodiments provide a multi-level mesa etching process that allows independent electrical contacts to be made to each of the separate active regions producing LEDs of two or three different colors in close proximity to each other on the same wafer. One or more embodiments include an n-type electrical contact made to the sidewalls of the etched mesas, instead of the contact made to planar n-type III-nitride (e.g., GaN) surfaces. A common n-contact, made from the side of the wafer opposite the substrate side, may be used for the entire array of red, green, and blue LED mesas.

An aspect of the disclosure pertains to a method of manufacturing a LED array. Referring first to FIG. 1, a LED device 100 is manufactured by forming a plurality of III-nitride layers on a substrate 101 to form a plurality of LEDs on the substrate including color-active regions. The color active regions include a first color active region 124, a second color active region 114 and a third color active region 104. While any order of stacking the different color active regions is within the scope of the disclosure, in specific embodiments, for a device emitting toward the substrate 101 from which the layers are formed, the color active region of shortest emission wavelength is the first color active region grown in the sequence of forming two or more color active regions. Accordingly in one or more embodiments, the first color active region 124 is formed on the substrate first and is a blue color active region, and then the second color active region 114 is formed, which is a green color active region, and then the third color active region 104, which is a read color active region, is formed. This sequence in which the first color active region 124 is blue, the second color active region 114 is green and the third color active region 104 is red avoids internal absorption of the emission from the blue color active region 124 by the color active regions of longer wavelengths.

Therefore, according to certain specific embodiments, the LED device 100 comprises a first LED including a first n-type layer 126 formed on the substrate, a first p-type layer 122 formed on the first n-type layer 126, and a first color active region 124 between the first n-type layer 126 and the first p-type layer 122. In one or more embodiments, the first color active region 124 is a blue color active region. In the embodiment shown, there is a first tunnel junction 120 on the first LED, in particular on the first p-type layer 122. A tunnel junction is a structure that allows electrons to tunnel from the valence band of a p-type layer to the conduction band of an n-type layer in reverse bias. The location where a p-type layer and an n-type layer abut each other is called a p/n junction. When an electron tunnels, a hole is left behind in the p-type layer, such that carriers are generated in both regions. Accordingly, in an electronic device like a diode, where only a small leakage current flows in reverse bias, a large current can be carried in reverse bias across a tunnel junction. A tunnel junction comprises a particular alignment of the conduction and valence bands at the p/n tunnel junction. This can be achieved by using very high doping (e.g., in the p++/n++ junction). In addition, III-nitride materials have an inherent polarization that creates an electric field at heterointerfaces between different alloy compositions. This polarization field can also be utilized to achieve band alignment for tunneling.

Still referring to FIG. 1, the LED device 100 further comprises a second LED including a second n-type layer 116 on the first tunnel junction 120, a second p-type layer 112 formed on the second n-type layer 116, and a second color active region 114 between the second n-type layer 116 and the second p-type layer 112. In one or more embodiments, the second color active region 114 is a green color active region. In the embodiment shown, there is a second tunnel junction 110 on the second LED, in particular on the second p-type layer 112. The LED device 100 further comprises a third LED including a third n-type layer 106 formed on the second tunnel junction 110, a third p-type layer 102 formed on the third n-type layer 106, and a third color active region 104 between the third n-type layer 106 and the third color active region. In one or more embodiments, the third color active region 104 is a green color active region.

The substrate 101 may be any substrate known to one of skill in the art which is configured for use in the formation of III-nitride LED devices. In one or more embodiments, the substrate comprises one or more of sapphire, silicon carbide, silica (Si), quartz, magnesium oxide (MgO), zinc oxide (ZnO), spinel, and the like. In specific embodiments, the substrate 101 comprises sapphire. In one or more embodiments, the substrate 101 is not patterned prior to formation of the LEDs on a top surface 101t of the substrate 101. Thus, in some embodiments, the substrate is 101 not patterned and can be considered to be flat or substantially flat. In other embodiments, the substrate 101 is a patterned substrate.

In one or more embodiments, the n-type layers and p-type layers of each of the first LED, the second LED and the third LED each comprise a layer of III-nitride material. In some embodiments, the III-nitride material comprises one or more of gallium (Ga), aluminum (Al), and indium (In). Thus, in some embodiments, the n-type and p-type layers of the respective LEDs comprise one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In specific embodiments, the n-type and p-type layers of the respective LEDs comprise n-doped and p-doped GaN.

In one or more embodiments, the layers of III-nitride material which form the first LED, the second LED and the third LED are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g. a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step maybe conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, a LED device 100 which is to form a LED array is manufactured by placing the substrate 101 in a metalorganic vapor-phase epitaxy (MOVPE) reactor so that the LED device layers are grown epitaxially. The first n-type layer 126 comprises one or more layers of semiconductor material that include different compositions and dopant concentrations. In specific embodiments, the first n-type layer 126 is formed by growing an epitaxial layer of a III-nitride, for example, n-GaN. The first p-type layer 122 comprises one or more layers of semiconductor material that include different compositions and dopant concentrations. In specific embodiments, the first p-type layer 122 is formed by growing an epitaxial layer of a III-nitride, for example, p-GaN. In use, an electrical current is caused to flow through the p-n junction in the first color active region 124, and the first color active region 124 generates light of a first wavelength determined in part by the bandgap energy of the materials. In some embodiments, the first LED comprising the first n-type layer 126, the first p-type layer 122, and the first color active region 124 includes one or more quantum wells. In one or more embodiments, the first color active region 124 is configured to emit blue light.

In specific embodiments, after completing formation of the first p-type layer 122 comprising the p-GaN layer of the blue LED, epitaxial growth conditions are then modified to grow the first tunnel junction 120. Then the second LED is formed, comprising the second n-type layer 116, the second p-type layer 112 and the second color active region 114 between the second n-type layer 116 and the second p-type layer 112. The second n-type layer 116 is formed by growing an epitaxial layer of a III-nitride, for example, n-GaN. The second p-type layer 112 comprises one or more layers of semiconductor material that include different compositions and dopant concentrations. In specific embodiments, the second p-type layer 112 is formed by growing an epitaxial layer of a III-nitride, for example, p-GaN. In use, an electrical current is caused to flow through the p-n junction in the second color active region 114, and the second color active region 114 generates light of a second wavelength determined in part by the bandgap energy of the materials. In some embodiments, the second LED comprising the second n-type layer 116, the second p-type layer 112, and the second color active region 114 includes one or more quantum wells. In one or more embodiments, the second color active region 114 is configured to emit green light. Formation of the second LED according to some embodiments includes changes to the thickness and/or growth conditions of the second n-type layer 116.

In specific embodiments, after completing formation of the second p-type layer 112 comprising the p-GaN layer of the green LED, epitaxial growth conditions are then modified to grow the second tunnel junction 110. Then the third LED is formed, comprising the third n-type layer 106, the third p-type layer 102 and the third color active region 104 between the third n-type layer 106 and the third p-type layer 102. The third n-type layer 106 is formed by growing an epitaxial layer of a III-nitride, for example, n-GaN. The third p-type layer 102 comprises one or more layers of semiconductor material that include different compositions and dopant concentrations. In specific embodiments, the third p-type layer 102 is formed by growing an epitaxial layer of a III-nitride, for example, p-GaN. In use, an electrical current is caused to flow through the p-n junction in the third color active region 104, and the third color active region 104 generates light of a third wavelength determined in part by the bandgap energy of the materials. In some embodiments, the third LED comprising the third n-type layer 106, the third p-type layer 102, and the third color active region 104 includes one or more quantum wells. In one or more embodiments, the third color active region 104 is configured to emit red light. Formation of the third LED according to some embodiments includes changes to the thickness and/or growth conditions of the third n-type layer 106.

The disclosure is not limited to any particular epitaxial designs of the first tunnel junction 120 and the second tunnel junction 110 or the LED color active regions. After epitaxial growth, of the first LED, the second LED and the third LED, a series of photolithography and dry etch processes are utilized to form a LED array 109 according to one or more embodiments, as shown in FIGS. 2-8. The end result of the photolithography and dry etch processes is an array of mesas with different heights as shown in FIG. 8. Quantum wells and p-n junctions not required for a particular emission color are etched away in some of the mesas, which results in mesas having a different height.

Figure 2:
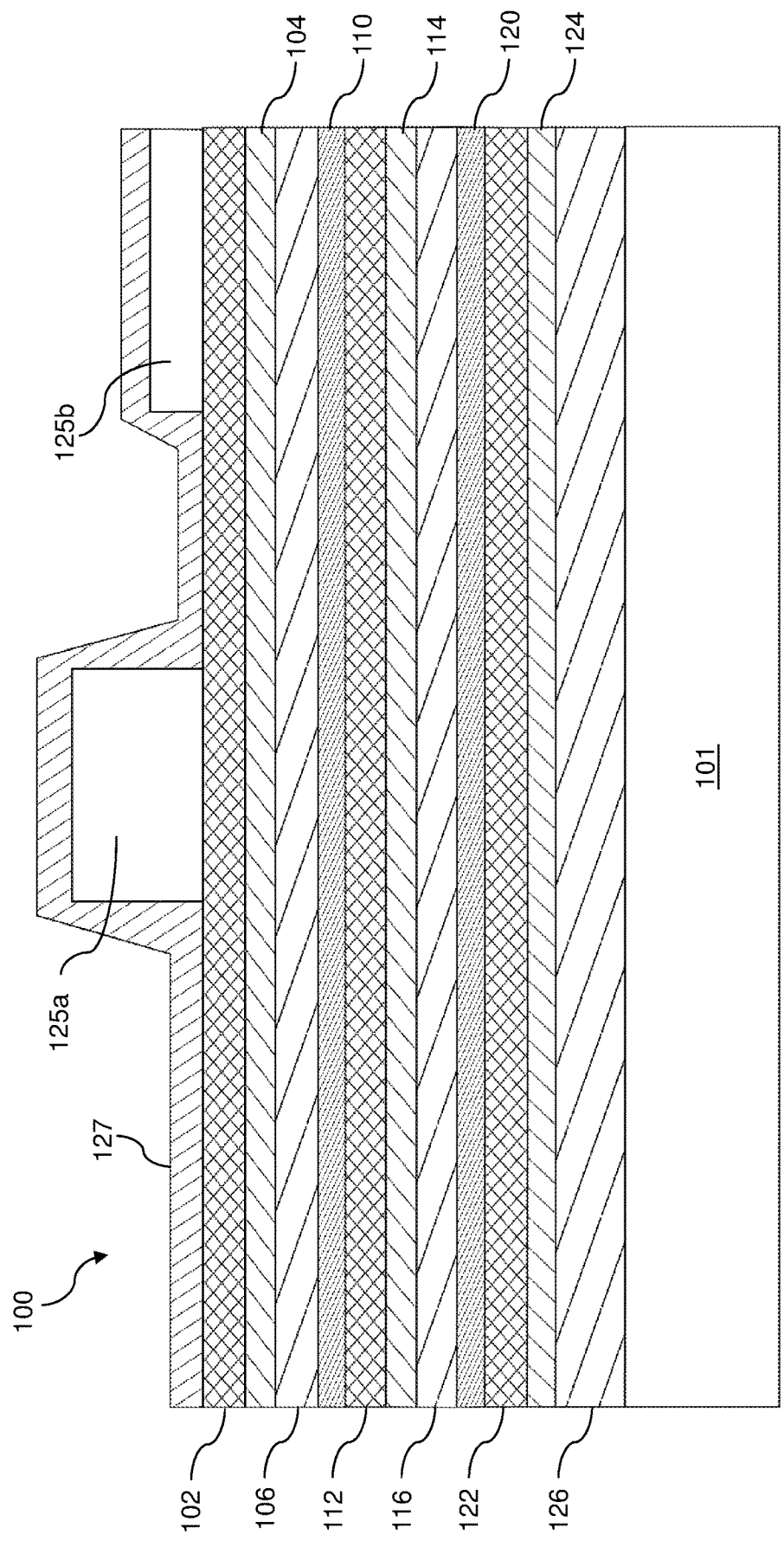
FIG. 2 illustrates sacrificial layers and an etch mask formed over the LED device of FIG. 1.

According to embodiments, a variety of options can be used in the photolithography and dry etch processes as will be discussed below. Routine processing steps such as photoresist exposure, development, strip and clean steps have been omitted from FIGS. 2-8. In one embodiment of an etch process, a first sacrificial layer 125a is patterned over a portion of the third p-type layer 102 where a mesa having the greatest height is desired as shown in FIG. 2. A second sacrificial layer 125b is patterned of a portion of the third type p-type layer 102 where an adjacent mesa having a height that is greater than the height of the first mesa. The first sacrificial layer 125a has a height that is greater than the second sacrificial layer 125b.

After formation of the first sacrificial layer 125a and the second sacrificial layer 125b, an etch mask layer 127 is deposited over the third p-type layer 102 not covered by the first sacrificial layer 125a and the second sacrificial layer 125 as well as over the first sacrificial layer 125a and the second sacrificial layer as shown in FIG. 2. In the embodiment shown, neither the material that forms the etch mask layer 127 nor the material that forms the first sacrificial layer 125a and the second sacrificial layer 125b is impervious to the dry etch chemistry. Therefore, for etch times long enough to etch through the etch mask layer 127 and/or the sacrificial layers, the depth etched into the epitaxial wafer depends on the thickness of the etch mask layer and the sacrificial layers. Adjacent mesas with different heights can then be obtained with a single dry etch step using the thickness of sacrificial layers and the differences in etch rates between sacrificial layers, the etch mask layer, and epitaxially formed layers of the first LED, the second LED and the third LED to control the height of each of the mesas. A first mesa 103 has a first height denoted by H, an adjacent mesa 105 has a second height, and a third mesa 107 has a third height. In the embodiment shown, the first height H of the first mesa 103 is less than a second height of the adjacent mesa 105, and a third height of the third mesa 107. The second height of the adjacent mesa 105 is greater than the third height of the third mesa 107. Thus, the first mesa 103 is the shortest of the three mesas. First trench 111 separates the first mesa 103 and the adjacent mesa 105, and second trench 113 separates the adjacent mesa 105 and the third mesa 107. The first mesa 103 has a sidewall 103s, the adjacent mesa 105 has a sidewall 105s, and the third mesa 107 has a sidewall 107s. In one or more embodiments, the sidewalls 103s, 105s and 107s are angled with respect to a top surface 101t of the substrate. The sidewall 103s of the first mesa 103, the sidewall 105s of the adjacent mesa 105 and the sidewall 107s of the third mesa 107 each form an angle "a" with the top surface 101t of the substrate 101 in a range of from 75 to less than 90 degrees.

In some embodiments, which will be discussed with respect to FIG. 8A, there is a first mesa 103 and an adjacent mesa 105. Thus, in such embodiments, only a first sacrificial layer is utilized and only a first trench is formed during the manufacturing process.

At the first trench 111 and the second trench 113, the etching process effectively stops at the substrate 101, as the substrate is nearly impervious to etching under conditions used to etch the III-nitride epitaxial layers. In one or more embodiments, the etch mask layer 127, the first sacrificial layer 125a and the second sacrificial layer 125b are comprised of the same material or different materials. Photoresists or dielectric materials such as silicon dioxide and silicon nitride can be used as suitable etch mask materials for the masking and etching processes.

In alternative embodiments of the etch process, first mesa 103, the adjacent mesa 105, and the third mesa 107 each having different heights are processed in separate dry etching steps. In a first etch step, mesas of equal heights are produced. The first etch step is stopped and some mesas are re-masked to prevent their heights from being reduced in subsequent etching steps. The mask layer is not completely etched through during the process and in some embodiments comprises a material that is impervious to the etch chemistry. This alternative embodiment exhibits a slower manufacturing throughput than the embodiment described in the previous paragraph, but exhibits less stringent control of parameters such as mask and sacrificial layer thickness and etch rate selectivity.

Following the end of the mesa etch process shown in FIG. 3 and suitable cleaning steps, activation of buried p-type layers is accomplished by laterally diffusing hydrogen through etched sidewalls of the buried p-type layers. According to one or more embodiments, the mesas are annealed after hydrogen diffusion rather than earlier in the process because the spaces in between the mesas allow for an efficient path for lateral diffusion and escape of hydrogen from the p-type layers. The annealing may be similar to those of a conventional LED or may use higher temperatures and/or longer times.

Figure 4:
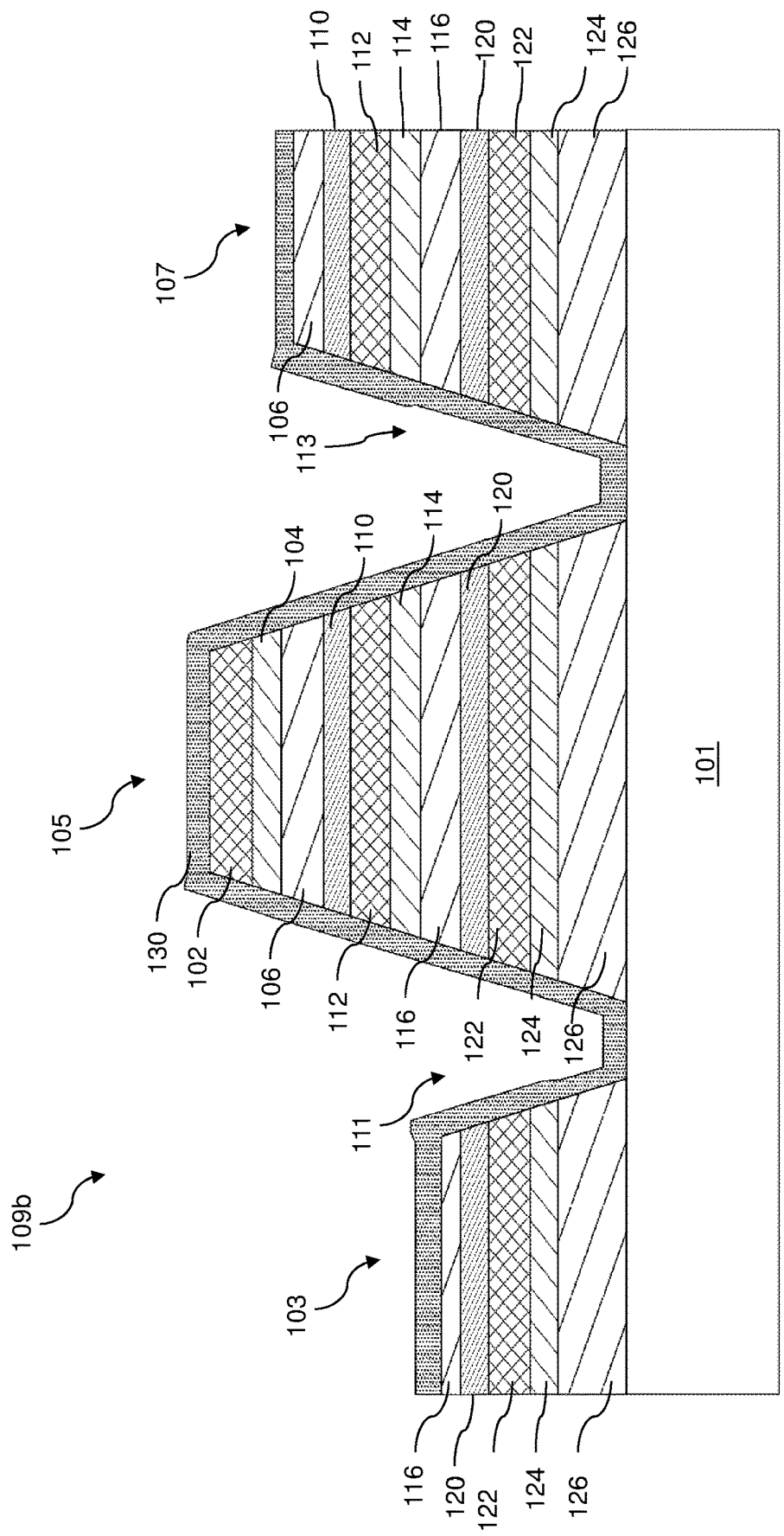
FIG. 4 illustrates a conformal dielectric layer on the three mesas of the LED array FIG. 3.

Referring now to FIG. 4, after the p-type layer activation anneal, a conformal coating of a dielectric layer 130, for example, silicon dioxide is deposited over the mesas and their sidewalls using a method such as plasma-enhanced chemical vapor deposition, atomic layer deposition, or sputtering. The dielectric layer 130 isolates metal contacts from each other will be fabricated in later process steps.

As used herein, the term "dielectric" refers to an electrical insulator material that can be polarized by an applied electric field. In one or more embodiments, the dielectric layer includes, but is not limited to, oxides, e.g., silicon oxide ($SiO_2$), aluminum oxide ($Al_2O_3$), nitrides, e.g., silicon nitride ($Si_3N_4$). In one or more embodiments, the dielectric layer comprises silicon nitride ($Si_3N_4$). In one or more embodiments, the dielectric layer comprises silicon oxide ($SiO_2$). In some embodiments, the dielectric layer composition is non-stoichiometric relative to the ideal molecular formula. For example, in some embodiments, the dielectric layer includes, but is not limited to, oxides (e.g., silicon oxide, aluminum oxide), nitrides (e.g., silicon nitride (SiN)), oxycarbides (e.g. silicon oxycarbide (SiOC)), and oxynitrocarbides (e.g. silicon oxycarbonitride (SiNCO)).

In one or more embodiments, the dielectric layer 130 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

Figure 5:
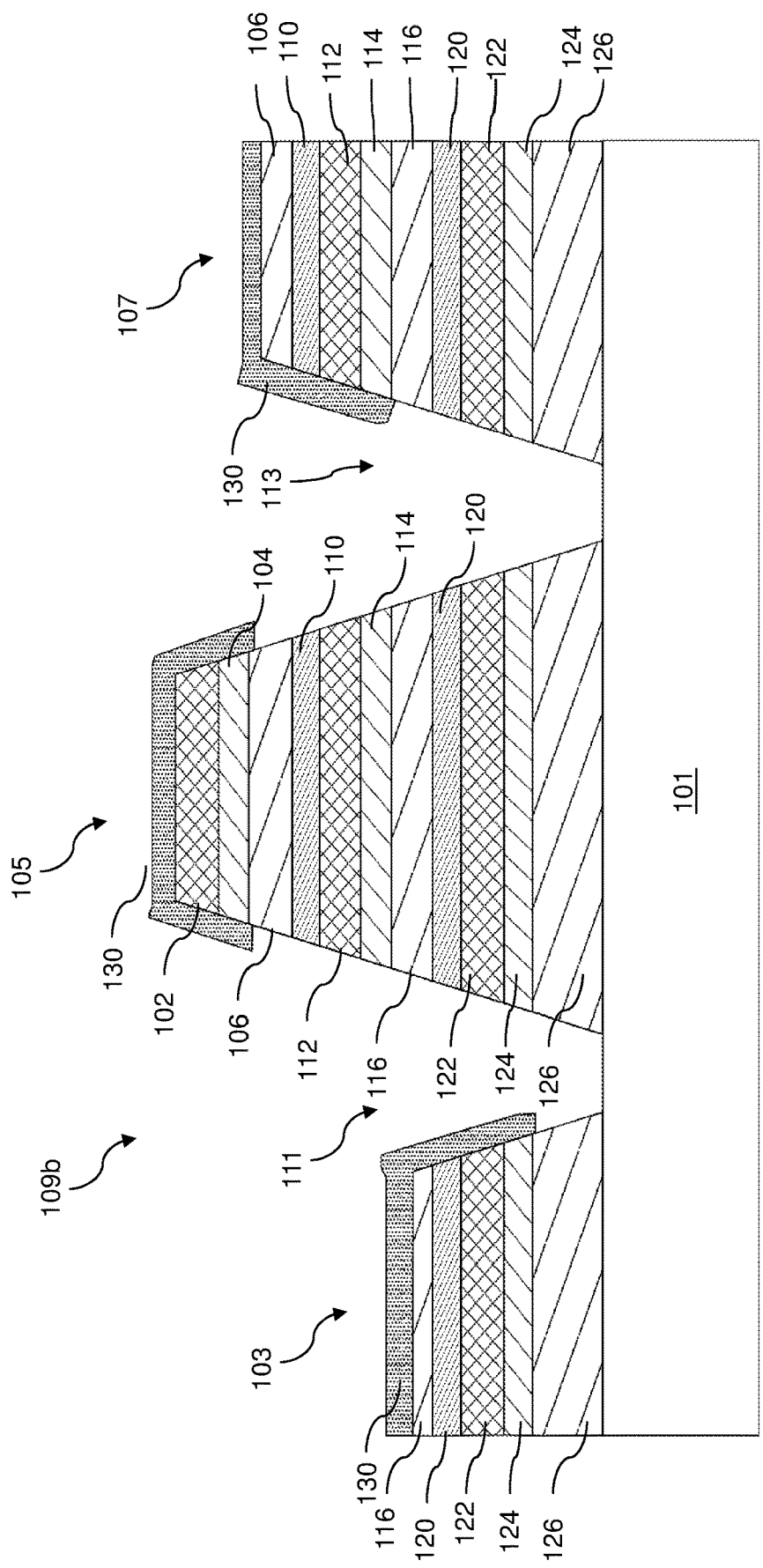
FIG. 5 illustrates the LED array of FIG. 4 after etching openings in the dielectric layer of the device of FIG. 4.

Referring now to FIG. 5, subsequently portions of the mesas are masked with resist and openings are dry etched in the dielectric layer 130. As shown in FIG. 5, the dielectric layer 130 only covers the sidewall 105s of the adjacent mesa 105 at the third p-type layer 102 and the third color active region 104 (red color active region) of the adjacent mesa 105. On the third mesa 107, the dielectric layer 130 extends over the sidewall 107s at only the third n-type layer 106, the second tunnel junction 110, the second p-type layer 112 and the second color active region 114 (green color active region). On the first mesa 103, the dielectric layer 130 covers only the sidewall 103s at the second n-type layer 116, the first tunnel junction 120, the first p-type layer 122 and the first color active region 124 (blue color active region).

Figure 6:
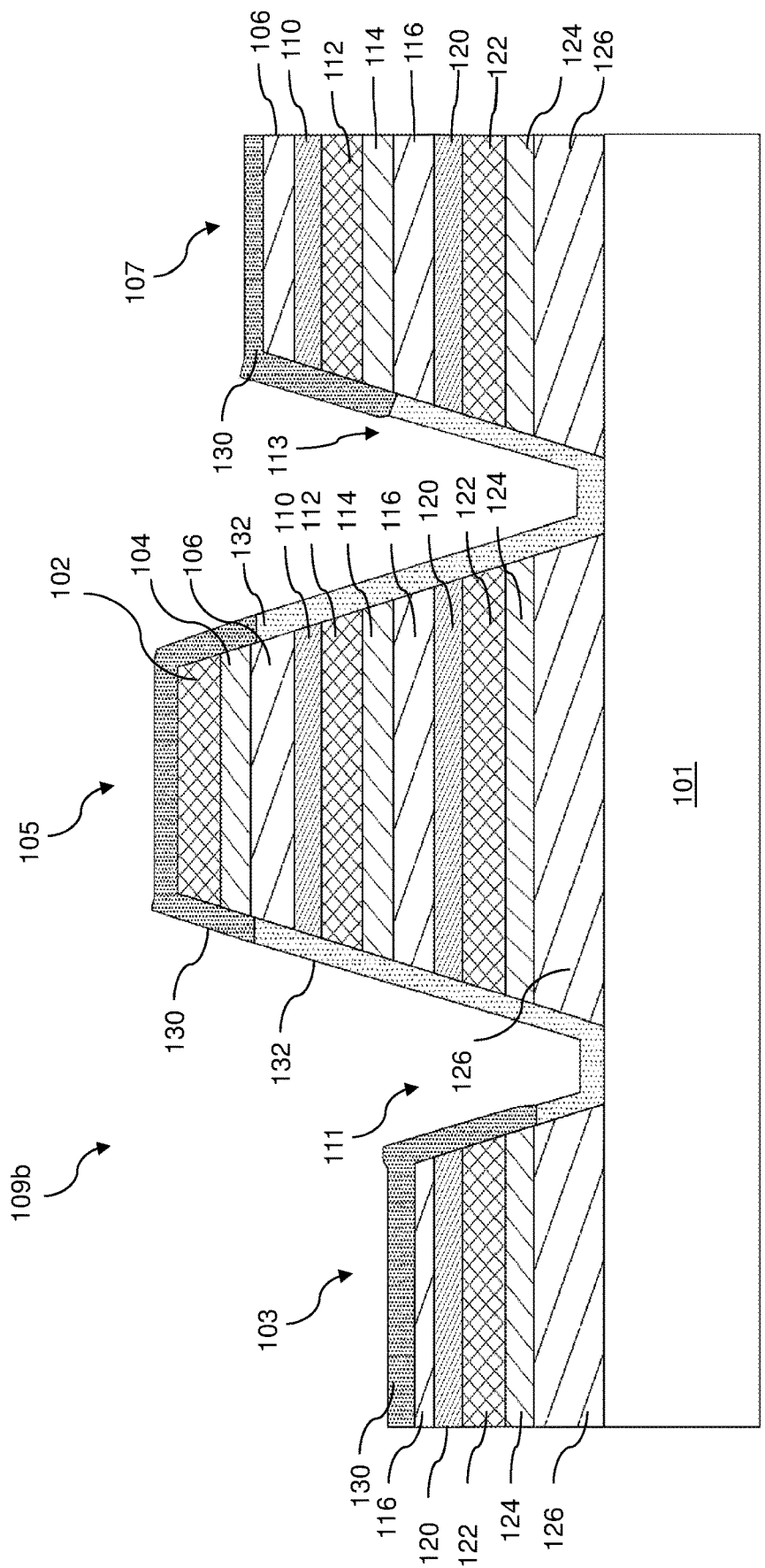
FIG. 6 illustrate illustrates the LED array of FIG. 5 after deposition of n-contact metallization in the openings.

Referring now to FIG. 6, an n-contact metallization layer 132 is deposited in the open areas left by the dry-etching step shown in FIG. 5. In one or more embodiments, the n-contact metallization layer 132 comprises an aluminum-containing metal layer and is deposited by physical vapor deposition and patterned as shown in FIG. 6. The n-contact metallization layer 132 covers sidewall over the n-type layer 126 of the first mesa 103 and the adjacent mesa 105. The n-contact metallization layer 132 extends to and covers the sidewall of the third n-type layer 106 of adjacent mesa 105. The n-contact metallization layer 132 extends to and covers the sidewall of the third mesa 107 to the second n-type layer 116.

Figure 7:
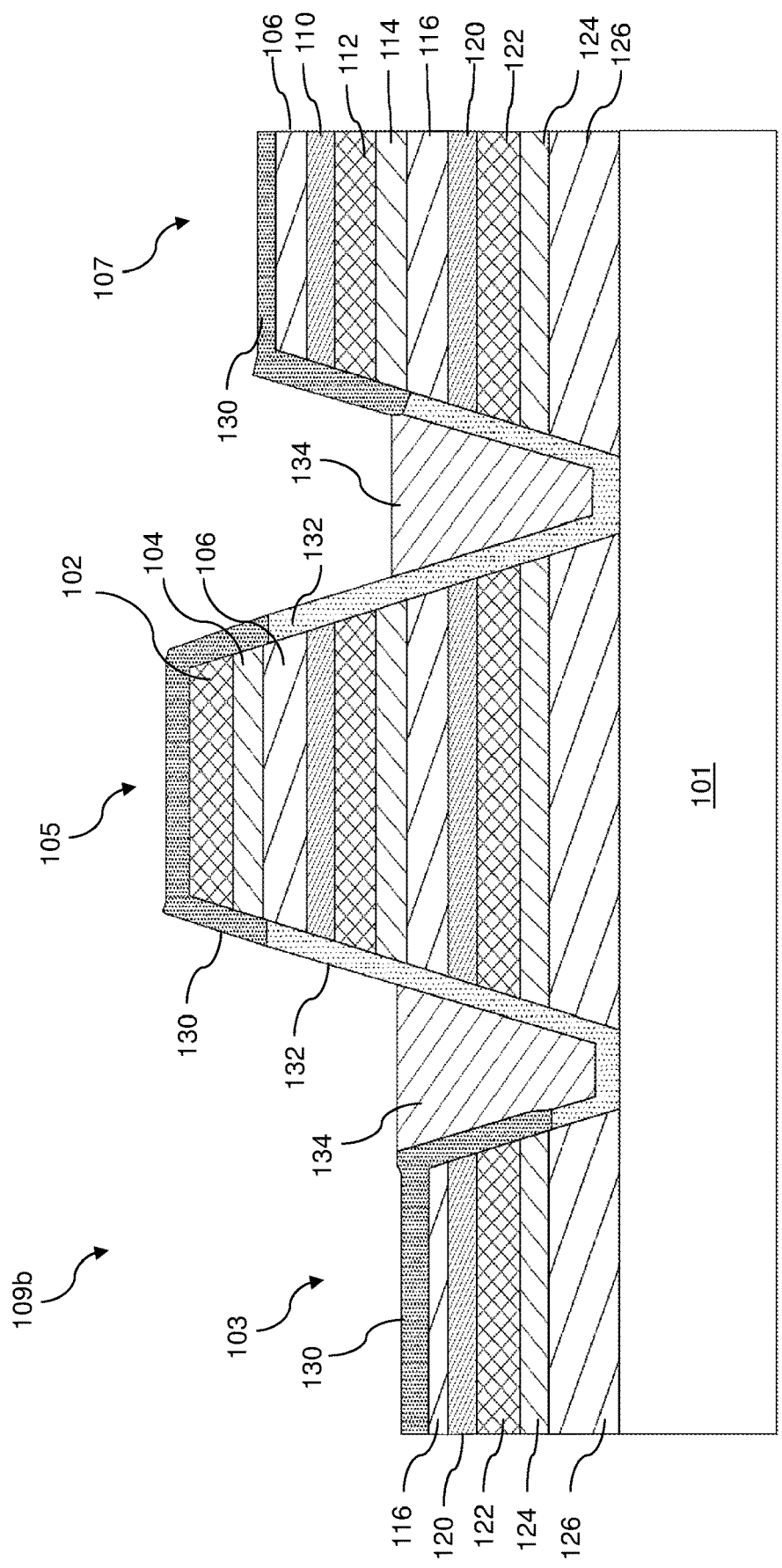
FIG. 7 illustrates the LED array of FIG. 6 after electrodeposition of conductive metal.

Referring now to FIG. 7, the first trench 111 and the second trench 113 between adjacent mesas are partially filled using solution-based electrodeposition of a metal such as copper using the previously deposited aluminum-containing metal as a seed layer. If needed, the electrodeposited metal may be planarized in a subsequent processing step using chemical-mechanical planarization.

Figure 8A:
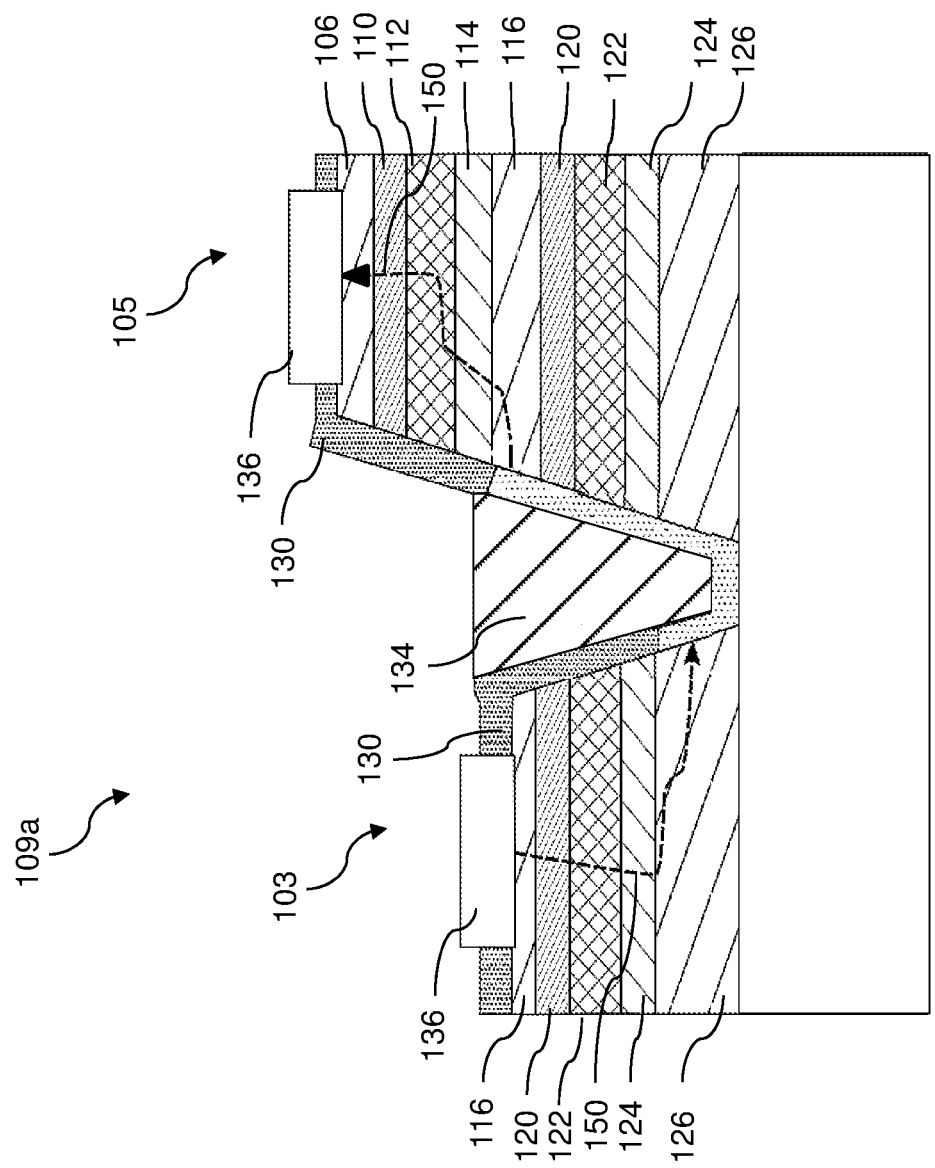
FIG. 8A illustrates an LED array comprising a first mesa and a second after p-contact formation
Figure 8B:
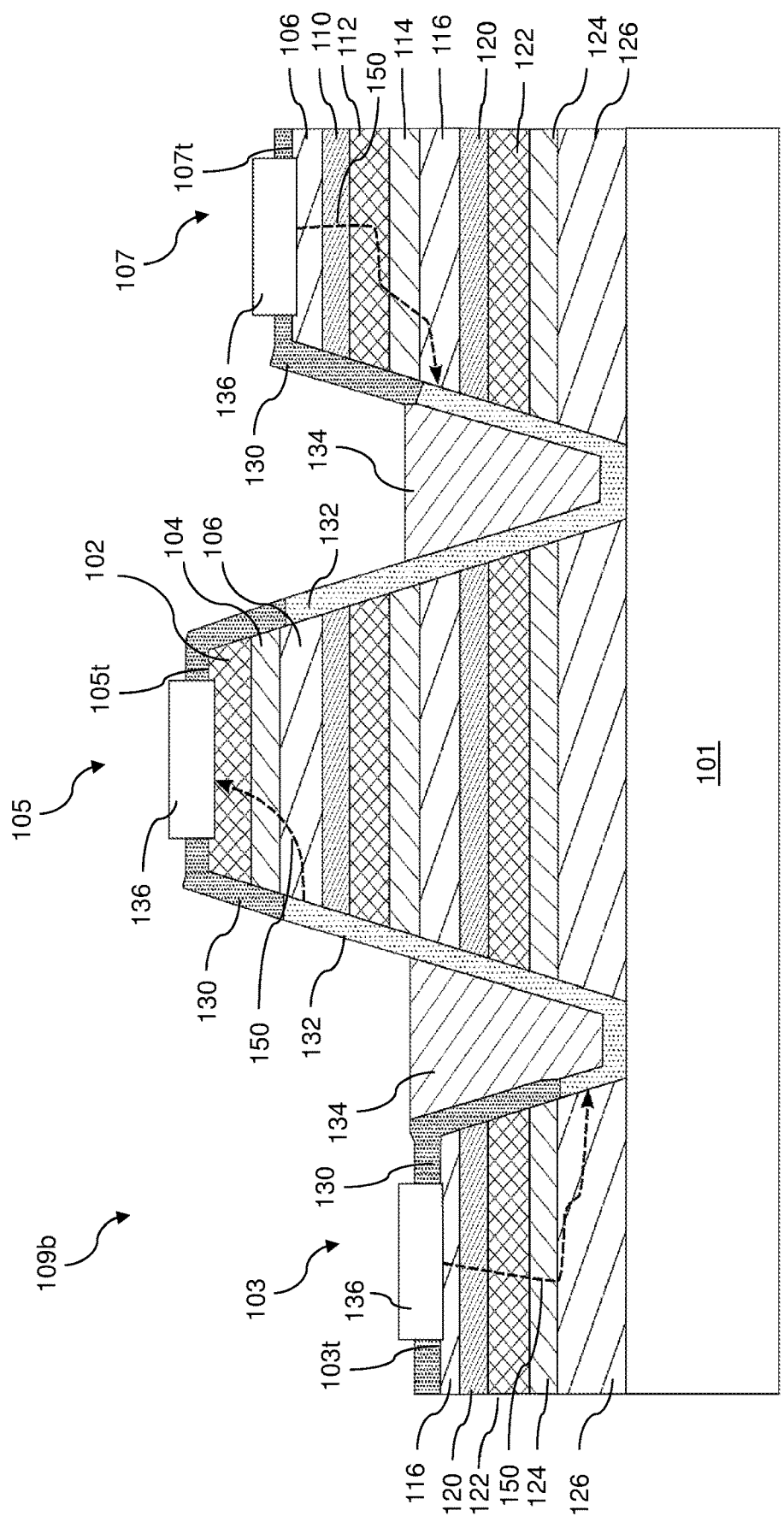
FIG. 8B illustrates the LED array of FIG. 7 after p-contact formation.

Referring now to FIG. 8B, after cleaning, the LED array 109 is masked again and a set of openings for p-type metallization contacts is patterned and another set of openings etched in the dielectric layer 130. Then, a p-type metallization contact comprising a conductive metal such as silver is patterned into the openings as shown in FIG. 8B. Optionally the patterning shown in FIG. 8B can be performed in separate photolithography and deposition steps if it is desired to use different contact metals for the p-electrode contact on the third p-type layer 102 (red LED) on the first mesa 103 and the p-type metallization contacts 136 on the n-GaN tunnel junction contacts of the blue LED of the third mesa 107 and the green LED of the adjacent mesa 105.

In FIG. 8B, the n-contact metallization layer 132 of the green LED third mesa 107 also contacts layers of the blue LED in the third mesa 107, and the n-contact metallization layer 132 of the red LED first mesa 103 also contacts layers of the green and blue LEDs in that mesa. This contact, however, does not prevent independent operation of adjacent LEDs sharing a common n-type electrode. The bias voltage in typical applications would not exceed 4V, which is insufficient to inject holes beyond the active region closed to the p-electrode even if the n-electron contacts layers deeper within the epitaxy structure. The dashed arrows 150 in FIG. 8B show the path of the current for typical bias of less than 4V.

Another aspect of the disclosure pertains to a LED array shown in FIGS. 8A and 8B. In a first embodiment shown in FIG. 8A a LED array 109a comprises a first mesa 103 comprising a top surface 103t, at least a first LED including a first p-type layer 122, a first n-type layer 126 and a first color active region 124 and a first tunnel junction 120 on the p-type layer 122 of the first LED, the top surface 103t of the first mesa 103 comprising a second n-type layer 116 on the first tunnel junction 120. Still referring to FIG. 8A, there is an adjacent mesa 150 comprising a top surface 105t, the first LED, a second LED including the second n-type layer 116, a second p-type layer 112, and a second color active region 114. There is a second tunnel junction 110 on the second LED of the adjacent mesa 105, and a third n-type layer 106 on the second tunnel junction 110 of the adjacent mesa 105. There is a first trench 111 separating the first mesa 103 and the adjacent mesa 105. There is n-type metallization 134 in the first trench 111 and in electrical contact with the first color active region 124 and the second color active region 114 of the adjacent mesa 105. There are p-type metallization contacts 136 on the second n-type layer 116 of the first mesa 103 and on the third n-type layer 106 of the adjacent mesa 105. In the embodiment shown in FIG. 8A, the top surface 105t of the adjacent mesa 105 comprises the third n-type layer 106.

The LED array 109a shown in FIG. 8 therefor comprises a single color (blue) LED formed by the first mesa 103 and a two color LED (glue and green) formed by the adjacent mesa 105).

FIG. 8B shows another embodiment of an LED array 109B comprising a first mesa 103 comprising a top surface 103t, at least a first LED including a first p-type layer 122, a first n-type layer 126 and a first color active region 124 and a first tunnel junction 120 on the p-type layer 122 of the first LED, the top surface 103t of the first mesa 103 comprising a second n-type layer 116 on the first tunnel junction 120. An adjacent mesa 105 comprises a top surface 105t, the first LED, a second LED including the second n-type layer 116, a second p-type layer 112, and a second color active region 114. There is a second tunnel junction 110 on the second LED of the adjacent mesa 105, namely on the p-type layer 112, and a third n-type layer 106 on the second tunnel junction 110 of the adjacent mesa 105. There is a first trench 111 separating the first mesa 103 and the adjacent mesa 105. There is n-type metallization 134 in the first trench 111 and in electrical contact with the first color active region 124 and the second color active region 114 of the adjacent mesa 104. There are p-type metallization contacts 136 on the second n-type layer of the first mesa and on the top surface 105t of the adjacent mesa 105.

The LED array 109b shown in FIG. 8B further comprises a third color active region 104 on the n-type layer 106 of the adjacent mesa 105 and the adjacent mesa comprises a top surface 105t including a third p-type layer 102. The LED array 109b further comprises a third mesa 107 comprising the first LED, the second LED, the second tunnel junction 110, and the third n-type layer 106 on the second tunnel junction 110. There is a second trench 113 separating the adjacent mesa 105 and the third mesa 107. There is n-type metallization 134 in the second trench 113 and in electrical contact with the first color active region 124 and the second color active region 114 of the third mesa 107 and the n-type metallization 134 in the first trench 111 in electrical contact with the first color active region 124, the second color active region 114 and the third color active region 104 of the adjacent mesa 105. In addition, there is a p-type metallization contact 136 on the third n-type layer 106 of the third mesa 107.

In some embodiments, the third p-type layer 102 of the adjacent mesa 105 is a non-etched p-type layer. In some embodiments, the first color active region 124 is a blue color active region and the second color active region 114 is a green color active region. In some embodiments, the first color active region 124 is a blue color active region, the second color active region 114 is a green color active region and the third color active region 104 is a red color active region.

In embodiments in which light is emitted toward the substrate side of the structure the heights of the mesas increase in the order of increasing emission wavelength (red>green>blue in this example).

Figure 9:
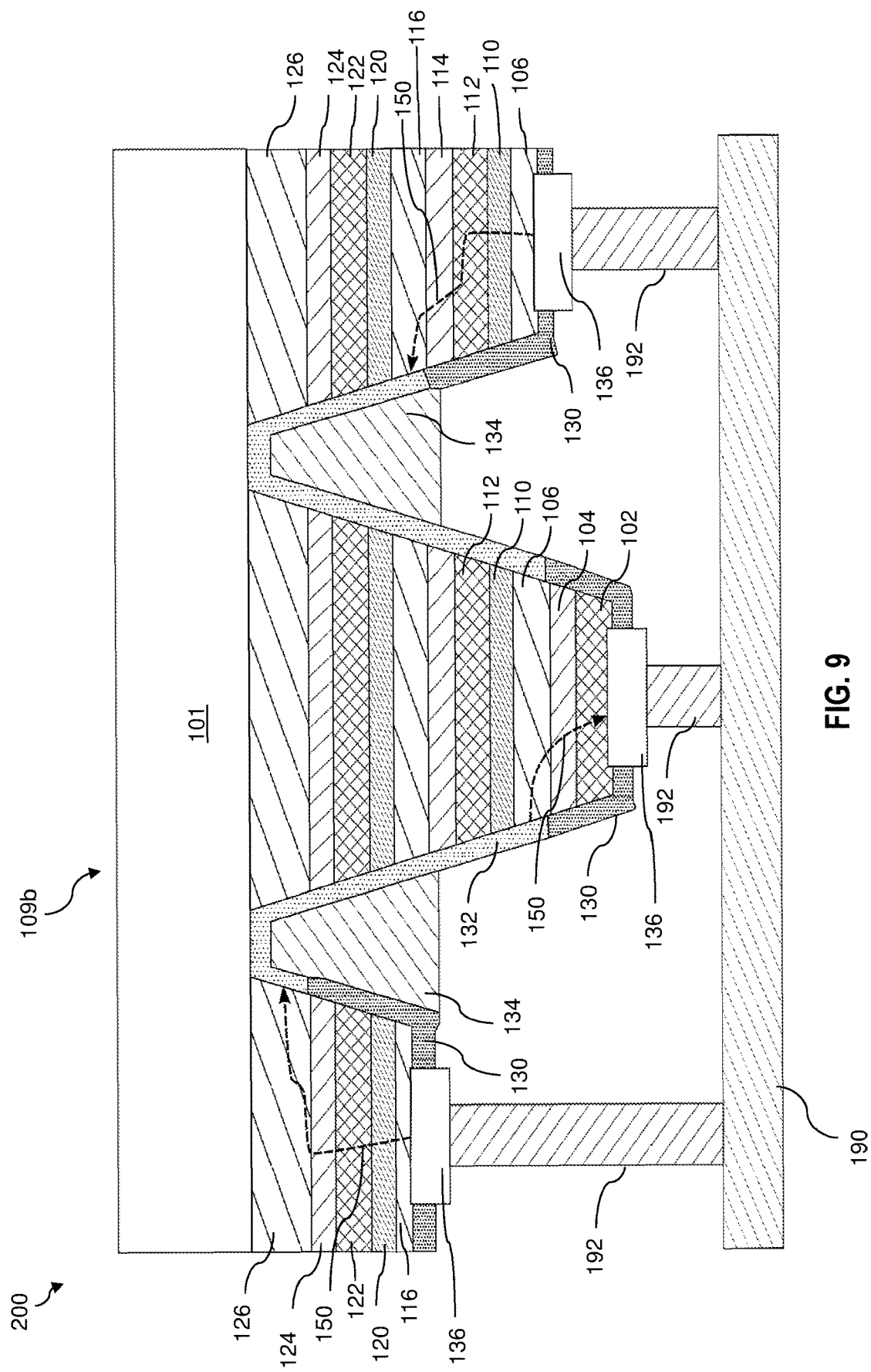
FIG. 9 illustrates the LED array of FIG. 7 connected to a backplane.

Referring now to FIG. 9, an electronic system 200 is shown comprising the LED array 109 of FIG. 8, and driver circuitry configured to provide independent voltages to one or more of the p-metallization contacts 136 of the first mesas, 103, the adjacent mesa 105 and the third mesa. This can be achieved by a backplane 190, such as a CMOS backplane 190 connected to the p-metallization contacts 136 by metal 192, such as metal solder bumps. In one or more embodiments, the electronic system is selected from the group consisting of a LED-based luminaire, a light emitting strip, a light emitting sheet, an optical display, and a microLED display.

Figure 10A:
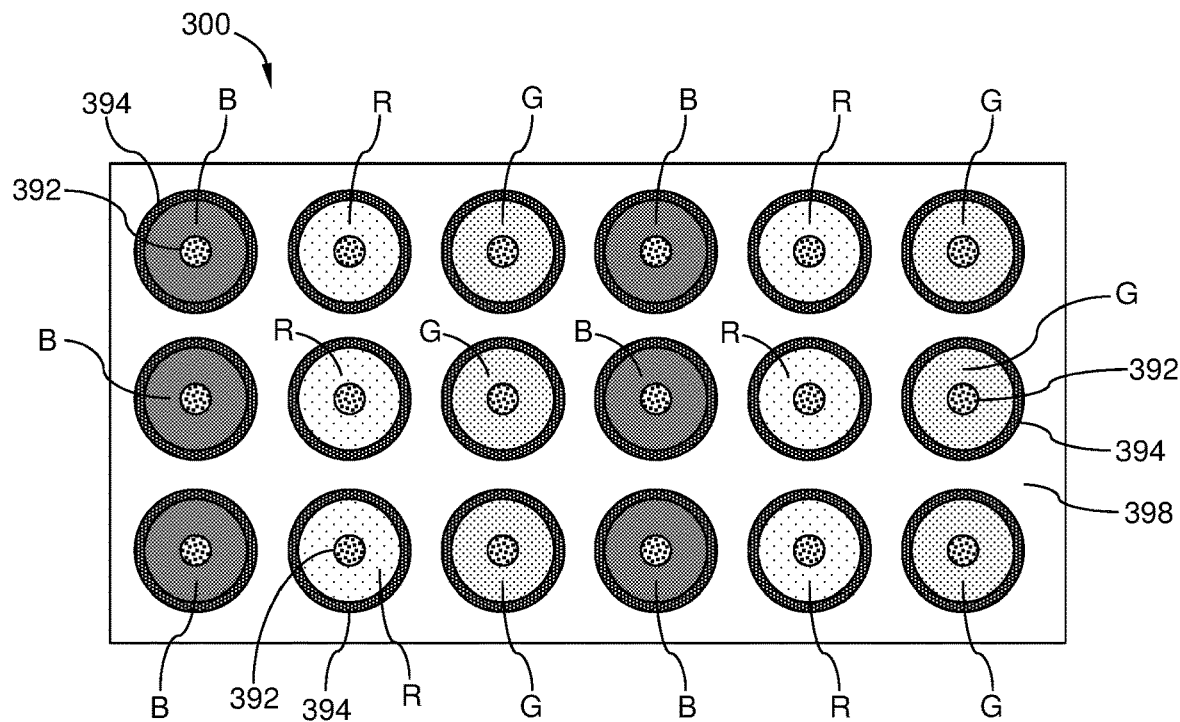
FIG. 10A illustrates a top view of a finished LED array according to an embodiment.

A top view of a partial section of an exemplary embodiment of a finished LED array 300 is shown in FIG. 10A. After fabrication of the LED array, in some embodiments, the wafer is diced into sections of suitable sizes and transferred to a display backplane or other receptacle which is connected to suitable driver electronics. Connections between the wafer and circuitry in the wafer receptacle are made with metal interconnect bonding or solder bumps depending on the sizes of mesas in the array and other requirements. The driver electronics allow the p-contact of any particular mesa within the array to be biased at a particular voltage more positive than the common n-contact which is at ground. The applied voltage is not necessarily the same for each different emission color. In view of the fact that the etch surrounding each mesa extends all the way down to the substrate, there is no guiding of light emitted by one mesa into adjacent mesas so the problem of cross-talk is avoided. In FIG. 10A, the array 300 is arranged in a pattern of Blue (B), Red (R), and Green (G) LEDs in a row. Each LED comprises a p-metallization contact 392 and is isolated from the n-metallization 398 by a dielectric layer 394.

Figure 10B:
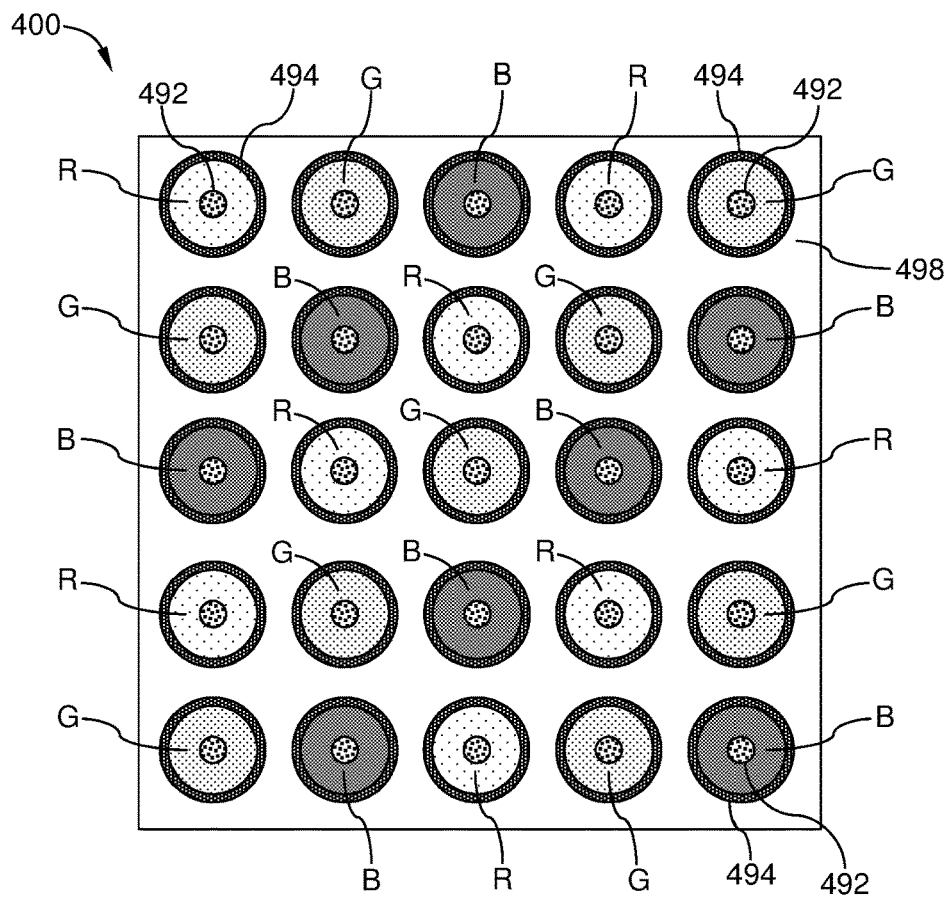
FIG. 10B illustrates a top view of a finished LED array according to a first alternative embodiment.

FIG. 10B shows another embodiment of an array 400 of LEDs, where the red (R), green (G) and blue (B) LEDs are in an X01 arrangement. Each LED has a p-metallization contact 492 and a dielectric layer 494 isolating each LED from n-metal 498.

Figure 10C:
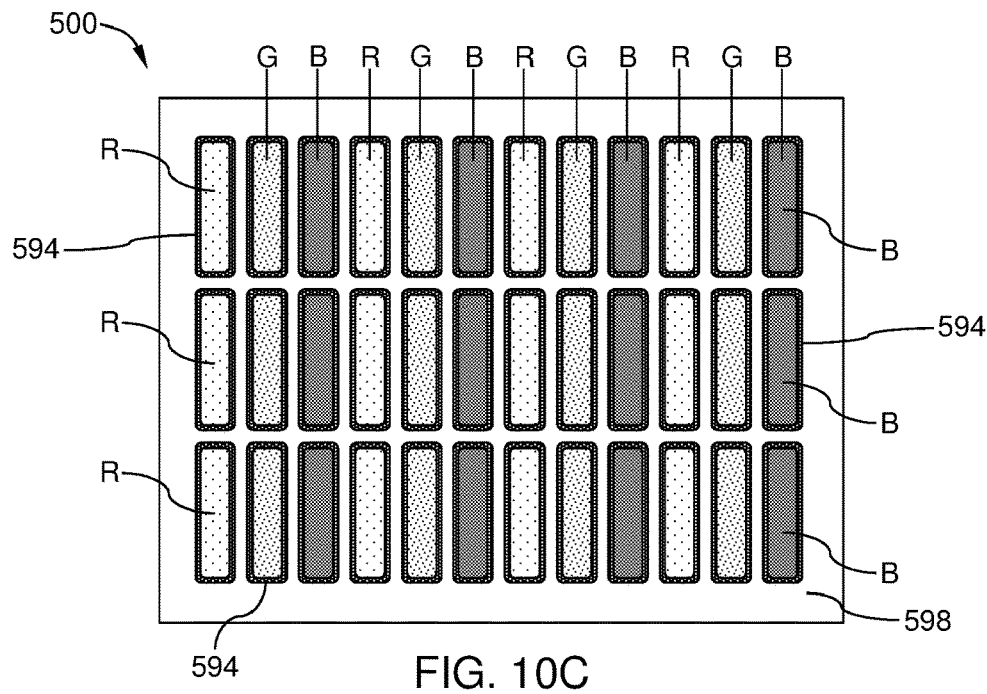
FIG. 10C illustrates a top view of a finished LED array according to a second alternative embodiment.

FIG. 10C shows another embodiment of an array 500 of LEDS, where the red (R), green (G) and blue (B) LEDs are in a simple RGB arrangement. Each LED is elongate in shape and has a p-metallization contact 592 and a dielectric layer 594 isolating each LED from n-metal 598.

Figure 10D:
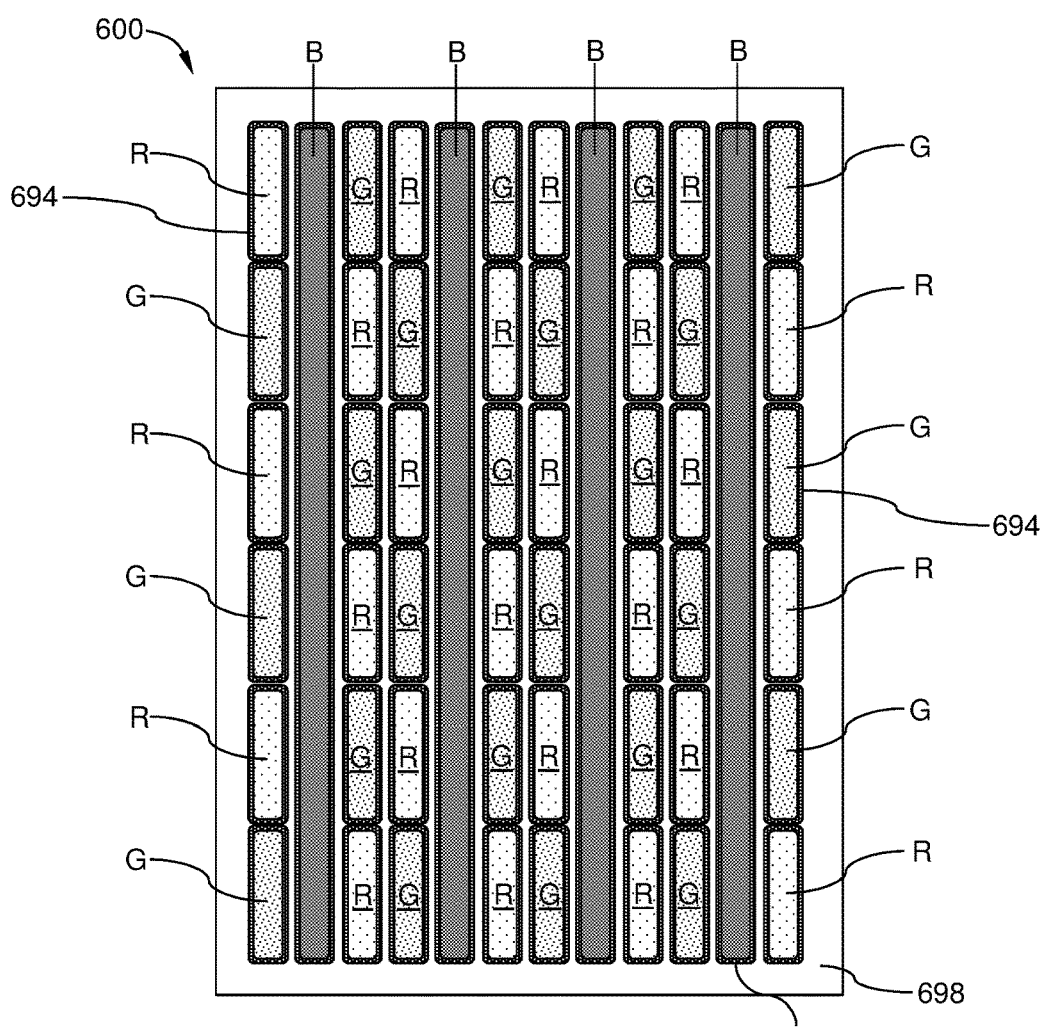
FIG. 10D illustrates a top view of a finished LED array according to a third alternative embodiment.

FIG. 10D shows another embodiment of an array 600 of LEDS, where the red (R), green (G) and blue (B) LEDs are in a PENTILE RBG-GBR arrangement. Each LED has a p-metallization contact 692 and a dielectric layer 694 isolating each LED from n-metal 698.

Figure 10E:
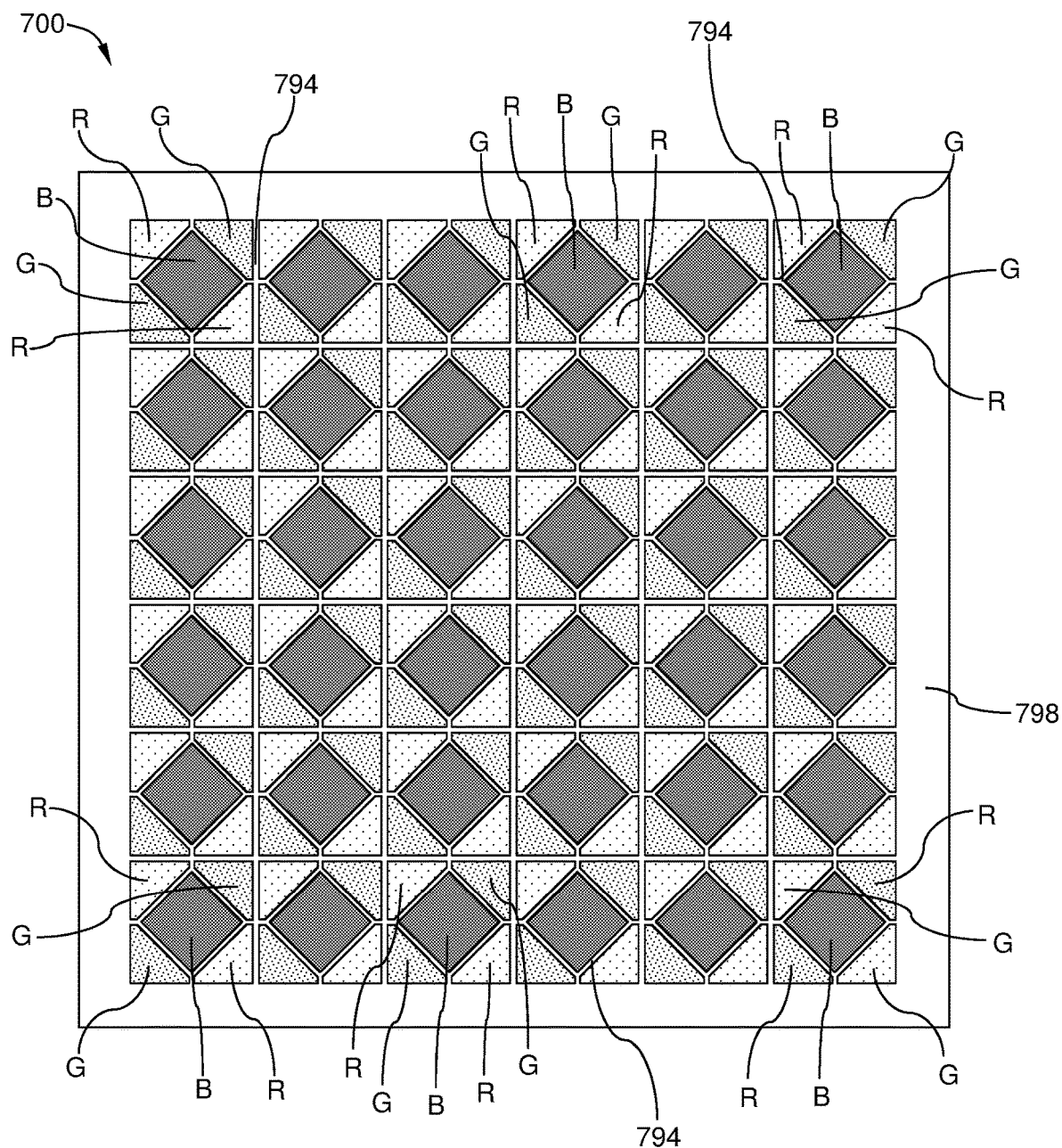
FIG. 10E illustrates a top view of a finished LED array according to a fourth alternative embodiment.

FIG. 10E shows another embodiment of an array 700 of LEDS, where the red (R), green (G) and blue (B) LEDs are in a PENTILE RG-B-GR arrangement. Each LED has a p-metallization contact 792 and a dielectric layer 794 isolating each LED from n-metal 798.

Simpler embodiments of the disclosure comprise the epitaxial growth sequence features only one tunnel junction (instead of two tunnel junctions) and active regions of only two colors (instead of three colors). While the figures show architectures where the substrate remains attached in the finished device, in some embodiments laser liftoff or other epitaxial film separation processes could be applied so that substrate 101 is removed in the finished device. Photoelectrochemical etching could be applied after the substrate 101 is removed to roughen the exposed GaN surface and improve light extraction efficiency.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting diode (LED) array comprising:
   a first mesa comprising a first stack having a top surface, at least a first LED including a first p-type layer, a first n-type layer and a first color active region and a first tunnel junction on the first LED, the first top surface of the first mesa comprising a second n-type layer on the first tunnel junction;
   an adjacent mesa comprising a top surface, the first LED, a second LED including the second n-type layer, a second p-type layer, and a second color active region;
   a second tunnel junction on the second LED of the adjacent mesa, and a third n-type layer on the second tunnel junction of the adjacent mesa;
   a first trench separating the first mesa and the adjacent mesa;
   a first metallization layer in the first trench, the first metallization layer extending continuously from and in electrical contact with the first color active region and the second color active region of the adjacent mesa; and
   second metallization contacts on the second n-type layer of the first mesa and on the top surface of the adjacent mesa.

2. The LED array of claim 1, wherein the top surface of the adjacent mesa comprises the third n-type layer.

3. The LED array of claim 1, further comprising:
a third color active region on the n-type layer of the adjacent mesa and the adjacent mesa comprises a top surface including a third p-type layer;
a third mesa comprising the first LED, second LED, the second tunnel junction, and the third n-type layer on the second tunnel junction;
a second trench separating the adjacent mesa and the third mesa;
a second first metallization layer in the second trench, the second first metallization layer extending continuously from and in electrical contact with the first color active region and the second color active region of the third mesa; and
the first metallization layer in the first trench extending continuously from and in electrical contact with the first color active region, the second color active region and the third color active region of the adjacent mesa; and
a second metallization contact on the third n-type layer of the third mesa.

4. The LED array of claim 3, wherein the third p-type layer of the adjacent mesa is a non-etched p-type layer.

5. The LED array of claim 3, wherein the first color active region is a blue color active region and the second color active region is a green color active region.

6. The LED array of claim 3, wherein the first color active region is a blue color active region, the second color active region is a green color active region and the third color active region is a red color active region.

7. The LED array of claim 1, wherein the first p-type layer, the second p-type layer, the first n-type layer and the second n-type layer comprise a III-nitride material.

8. The LED array of claim 7, wherein the III-nitride material comprises GaN.

9. The LED array of claim 3, wherein the first p-type layer, the second p-type layer, the third p-type layer, the first n-type layer, the second n-type layer and the third n-type layer comprise a III-nitride material.

10. The LED array of claim 9, wherein the III-nitride material comprises GaN.

11. The LED array of claim 1, wherein the first mesa has a sidewall and the adjacent mesa has a sidewall and the first mesa sidewall and the adjacent mesa sidewall form an angle with a top surface of a substrate upon which the mesas are formed in a range of from 75 to less than 90 degrees.

12. An electronic system comprising:
the LED array of claim 1; and
driver circuitry configured to provide independent voltages to one or more of p-metallization contacts.

13. The electronic system of claim 12, wherein the electronic system is selected from the group consisting of a LED-based luminaire, a light emitting strip, a light emitting sheet, an optical display, and a microLED display.

14. A method of manufacturing an LED array, the method comprising:
forming a first mesa comprising a top surface, at least a first LED including a first p-type layer, a first n-type layer and a first color active region and a first tunnel junction on the first LED, the top surface comprising a second n-type layer on the first tunnel junction;
forming an adjacent mesa comprising the first LED, a second LED including the second n-type layer, a second p-type layer and a second color active region;
forming a second tunnel junction on the second LED of the adjacent mesa, and a third n-type layer on the second tunnel junction of the adjacent mesa p-type layer;
forming a first trench separating the first mesa and the adjacent mesa;
forming a first metallization layer in the first trench, extending continuously from and in electrical contact with the first color active region and the second color active region of the adjacent mesa; and
forming second metallization contacts on the second n-type layer of the first mesa and on the third n-type layer of the adjacent mesa.

15. The method of claim 14, further comprising forming a top surface of the adjacent mesa comprising the third n-type.

16. The method of claim 14, further comprising:
forming a third color active region on the n-type layer of the adjacent mesa and the adjacent mesa comprises a top surface including a third p-type layer;
forming a third mesa comprising a top surface, the first LED, the second LED, the second tunnel junction, and including the third n-type layer on the second tunnel junction;
and the third color active region, the top surface of the third mesa comprising the third n-type layer;
forming a second trench separating the adjacent mesa and the third mesa;
forming a second first metallization layer in the second trench, the second first metallization layer extending continuously from and in electrical contact with the first color active region and the second color active region of the third mesa and the first metallization layer in the first trench extending continuously from and in electrical contact with the first color active region, the second color active region and the third color active region of the second adjacent mesa, and the first metallization in the first trench in electrical contact with the third color active region; and
forming a second metallization contact on the third n-type layer of the third mesa.

17. The method of claim 16, wherein each of the first LED, the second LED and the third LED comprise epitaxially deposited III-nitride material.

18. The method of claim 17, wherein the first LED, the second LED and the third LED are formed on a substrate.

19. The method of claim 18, wherein the first trench and second trench are formed by etching trenches to form the first mesa, the adjacent mesa and the third mesa.

20. A light emitting diode (LED) array comprising:
a first mesa adjacent to a second mesa, the second mesa adjacent to a third mesa;
the first mesa comprising a first stack and having a first mesa second metallization contact on a first mesa second n-type layer, the first mesa second n-type layer on a first mesa tunnel junction, the first mesa tunnel junction on a first mesa LED on a substrate, the first mesa LED including a first mesa first p-type layer, a first mesa first n-type layer, and a first mesa first color active region;
the second mesa comprising a second stack and having a second mesa second metallization contact on a second mesa third p-layer, the second mesa third p-type layer on a second mesa second tunnel junction, the second mesa tunnel junction on a second mesa second LED, the second mesa second LED on a second mesa first tunnel junction, the second mesa first tunnel junction on a second mesa first LED on the substrate, the second mesa second LED comprising a second mesa second n-type layer, a second mesa second p-type layer, and a second mesa second color active region, and the second mesa first LED including a second mesa first p-type layer, a second mesa first n-type layer, and a second mesa first color active region;

the third mesa comprising a third stack and having a third mesa second metallization contact on a third mesa third n-type layer, the third mesa third n-type layer on the third mesa second tunnel junction, the third mesa second tunnel junction on a third mesa second LED, the third mesa second LED on a third mesa first tunnel junction, the third mesa first tunnel junction on a third mesa first LED on the substrate, the third mesa second LED comprising a third mesa second n-type layer, a third mesa second p-type layer, and a third mesa second color active region, and the third mesa first LED including a third mesa first p-type layer, a third mesa first n-type layer, and a third mesa first color active region;

a first trench separating the first mesa and the second mesa;

a second trench separating the second mesa and the third mesa;

a first metallization layer in the first trench, extending continuously from and in electrical contact with the first mesa first color active region and the second mesa second color active region; and a second first metallization layer in the second trench, the second first metallization layer extending continuously from and in electrical contact with the second mesa first color active region and the third mesa second color active region.

* * * * *